US010840364B2

(12) United States Patent
Yoneda

(10) Patent No.: US 10,840,364 B2
(45) Date of Patent: Nov. 17, 2020

(54) SEMICONDUCTOR DEVICE

(71) Applicant: DENSO CORPORATION, Kariya (JP)

(72) Inventor: Shuji Yoneda, Kariya (JP)

(73) Assignee: DENSO CORPORATION, Kariya (JP)

( * ) Notice: Subject to any disclaimer, the term of this patent is extended or adjusted under 35 U.S.C. 154(b) by 82 days.

(21) Appl. No.: 16/358,756

(22) Filed: Mar. 20, 2019

(65) Prior Publication Data
US 2019/0221658 A1 Jul. 18, 2019

Related U.S. Application Data

(63) Continuation of application No. PCT/JP2018/001883, filed on Jan. 23, 2018.

(30) Foreign Application Priority Data

Mar. 6, 2017 (JP) .................. 2017-042062

(51) Int. Cl.
*H01L 29/66* (2006.01)
*H01L 29/739* (2006.01)
(Continued)

(52) U.S. Cl.
CPC ...... *H01L 29/7397* (2013.01); *H01L 27/0716* (2013.01); *H01L 29/0696* (2013.01);
(Continued)

(58) Field of Classification Search
CPC ............. H01L 29/7397; H01L 29/0696; H01L 29/407; H01L 29/739; H01L 27/0716; H01L 29/0821; H01L 29/0804; H01L 29/1095; H01L 21/822; H01L 29/1608; H01L 29/0834
(Continued)

(56) References Cited

U.S. PATENT DOCUMENTS 7,615,846 B2 * 11/2009 Harada ............... H01L 29/7397
257/578
7,977,704 B2 * 7/2011 Koyama ............. H01L 29/7395
257/139
(Continued)

FOREIGN PATENT DOCUMENTS

JP 2010-238721 A 10/2010
JP 2011-176244 A 9/2011
JP 2014-053552 A 3/2014

*Primary Examiner* — Vu A Vu
(74) *Attorney, Agent, or Firm* — Posz Law Group, PLC

(57) ABSTRACT

A semiconductor device includes: a semiconductor substrate providing a drift layer; a base layer; a plurality of trenches; an emitter region; an emitter electrode; a collector layer; a collector electrode; a main gate electrode for providing an inversion layer and a dummy gate electrode not providing the inversion layer; a common gate pad; a first element that is arranged between the dummy gate electrode and the gate pad, shuts down or restricts conduction when applying a first voltage, and permits the conduction when applying a second voltage; and a second element that is arranged between the emitter electrode and a connection point between the dummy gate electrode and the first element, permits the conduction when applying the first voltage, and shuts down or restricts the conduction when applying the second voltage.

8 Claims, 10 Drawing Sheets

(51) Int. Cl.
| | |
|---|---|
| *H01L 27/07* | (2006.01) |
| *H01L 29/08* | (2006.01) |
| *H01L 29/10* | (2006.01) |
| *H01L 29/06* | (2006.01) |
| *H01L 29/40* | (2006.01) |
| *H01L 21/822* | (2006.01) |
| *H01L 29/16* | (2006.01) |

(52) U.S. Cl.
CPC ...... *H01L 29/0804* (2013.01); *H01L 29/0821* (2013.01); *H01L 29/1095* (2013.01); *H01L 29/407* (2013.01); *H01L 29/739* (2013.01); *H01L 21/822* (2013.01); *H01L 29/1608* (2013.01)

(58) Field of Classification Search
USPC ........................................................ 257/330
See application file for complete search history.

(56) References Cited

U.S. PATENT DOCUMENTS

| | | | |
|---|---|---|---|
| 8,178,947 B2* | 5/2012 | Takahashi | H01L 29/7397 257/565 |
| 8,426,944 B2* | 4/2013 | Yoneda | H01L 29/7397 257/592 |
| 9,257,543 B2* | 2/2016 | Takahashi | H01L 29/0619 |
| 9,613,950 B1* | 4/2017 | Iwasaki | H01L 27/0727 |
| 9,887,191 B2* | 2/2018 | Hata | H01L 27/0664 |
| 10,192,978 B2* | 1/2019 | Okuda | H01L 29/4238 |
| 2010/0090248 A1 | 4/2010 | Kouno | |
| 2012/0306528 A1 | 12/2012 | Heinisch et al. | |
| 2016/0020310 A1 | 1/2016 | Shiga et al. | |
| 2016/0351561 A1* | 12/2016 | Senoo | H01L 29/0619 |
| 2016/0372585 A1* | 12/2016 | Furukawa | H01L 29/407 |
| 2018/0204909 A1* | 7/2018 | Konishi | H01L 29/407 |

* cited by examiner

SEMICONDUCTOR DEVICE

CROSS REFERENCE TO RELATED APPLICATION

The present application is a continuation application of International Patent Application No. PCT/JP2018/001883 filed on Jan. 23, 2018, which designated the U.S. and claims the benefit of priority from Japanese Patent Application No. 2017-42062 filed on Mar. 6, 2017. The entire disclosures of all of the above applications are incorporated herein by reference.

TECHNICAL FIELD

The present disclosure relates to a semiconductor device including a dummy gate electrode placed in a trench via a gate insulator film.

BACKGROUND

A semiconductor device includes a dummy gate electrode placed in a trench via a gate insulator film.

The above semiconductor device includes a dummy gate pad for a dummy gate electrode apart from a pad for a main gate electrode. This makes it possible to apply a voltage to the dummy gate pad and perform withstand voltage inspection on a gate insulator film in the dummy gate electrode. After the withstand voltage inspection, a bonding wire can be used to couple the dummy gate pad with an emitter electrode and thereby stabilize an electric potential of the dummy gate electrode so as not to generate an inversion layer.

SUMMARY

A semiconductor device includes: a semiconductor substrate providing a drift layer; a base layer; a plurality of trenches; an emitter region; an emitter electrode; a collector layer; a collector electrode; a main gate electrode for providing an inversion layer and a dummy gate electrode not providing the inversion layer; a common gate pad; a first element that is arranged between the dummy gate electrode and the gate pad, shuts down or restricts conduction when applying a first voltage, and permits the conduction when applying a second voltage; and a second element that is arranged between the emitter electrode and a connection point between the dummy gate electrode and the first element, permits the conduction when applying the first voltage, and shuts down or restricts the conduction when applying the second voltage.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
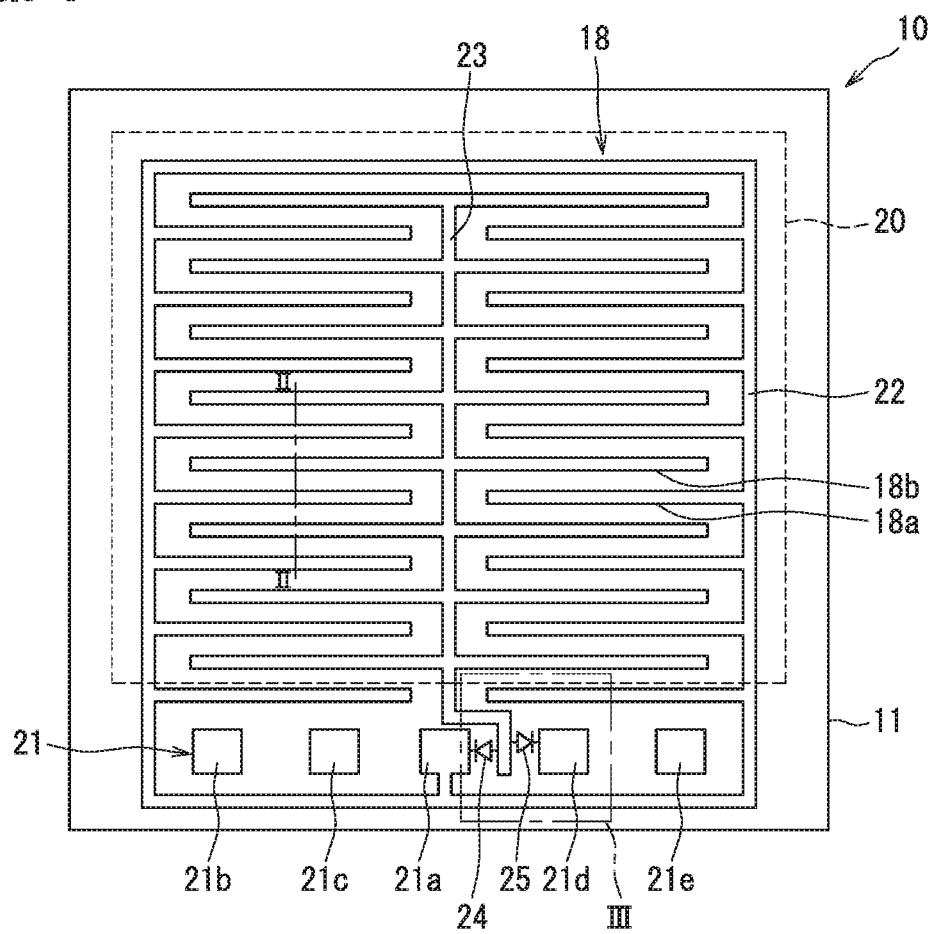
FIG. 1 is a plan view illustrating a schematic configuration of a semiconductor device according to a first embodiment.

A comparison example of a semiconductor device requires electrically coupling a dummy gate pad with an emitter electrode after performing the withstand voltage inspection on the gate insulator film in the dummy gate electrode. For example, a bonding wire process is needed.

A semiconductor device is provided to be capable of performing withstand voltage inspection on a gate insulator film in a dummy gate electrode and stabilizing an electric potential so as not to generate an inversion layer without coupling a pad with an emitter electrode after the withstand voltage inspection.

According to an example embodiment, a semiconductor device includes: a semiconductor substrate providing a drift layer having a first conductivity type; a base layer having a second conductivity type and arranged over the drift layer; a plurality of trenches that penetrates the base layer and reaches the drift layer; an emitter region having the first conductivity type, arranged in a surface portion of the base layer, and contacting the trench; an emitter electrode coupled with the base layer and the emitter region; a collector layer having the first conductivity type and arranged on the drift layer opposite to the base layer; a collector electrode coupled with the collector layer; a gate insulator film arranged over a wall surface of the trench; a gate electrode arranged in the trench via the gate insulator film, including a main gate electrode for providing an inversion layer coupling between the emitter electrode and the drift layer when applying a voltage thereon and at least one dummy gate electrode not contributing to generation of the inversion layer; a gate pad common to the main gate electrode and the dummy gate electrode; a first element that is arranged between the dummy gate electrode and the gate pad, shuts down or restricts conduction in order for the dummy gate electrode not to contribute to the generation of the inversion layer when a first voltage is applied to the main gate electrode via the gate pad in order to generate the inversion layer, and permits the conduction when a second voltage having a polarity reverse to the first voltage is applied to the gate pad; and a second element that is arranged between the emitter electrode and a connection point between the dummy gate electrode and the first element, permits the conduction when applying the first voltage, and shuts down or restricts the conduction when applying the second voltage.

The above-described semiconductor device includes the first element and the second element. Therefore, applying a second voltage for inspection to a gate pad applies a voltage between an emitter electrode and a dummy gate electrode while the voltage is needed for the withstand voltage inspection on a gate insulator film in a dummy gate electrode. This makes it possible to perform the withstand voltage inspection on the gate insulator film in the dummy gate electrode.

Even when the gate pad is shared, supposing that a first voltage for operation is applied to the gate pad and the main gate electrode generates an inversion layer; an electric potential of the dummy gate electrode can be stabilized to an electric potential not contributing to the generation of an inversion layer such as an electric potential equal to that of the emitter electrode.

As above, it is possible to perform withstand voltage inspection on a gate insulator film in a dummy gate electrode and stabilize an electric potential so as not to generate an inversion layer without coupling a pad with an emitter electrode after the withstand voltage inspection.

According to an example embodiment, a semiconductor device includes: a semiconductor substrate providing a drift layer having a first conductivity type; a base layer having a second conductivity type and arranged over the drift layer; a plurality of trenches that penetrates the base layer and reaches the drift layer; an emitter region having the first conductivity type, arranged in a surface portion of the base layer, and contacting the trench; an emitter electrode coupled with the base layer and the emitter region; a collector layer having the first conductivity type and arranged on the drift layer opposite to the base layer; a collector electrode coupled with the collector layer; a gate insulator film arranged over a wall surface of the trench; a gate electrode arranged in the trench via the gate insulator film, including a main gate electrode for providing an inversion layer coupling between the emitter electrode and the drift layer when applying a voltage thereon and at least one dummy gate electrode not contributing to generation of the inversion layer; a main gate pad coupled with the main gate electrode; a dummy gate pad coupled with the dummy gate electrode; and a third element that is arranged between the emitter electrode and a connection point between the dummy gate electrode and the dummy gate pad, shuts down or restricts conduction when a predetermined voltage is applied to the dummy gate pad, and permits the conduction when the dummy gate pad is in an open state without applying a voltage thereon.

The above-described semiconductor device includes the third element and the dummy gate pad described above. Therefore, applying a specified voltage to the dummy gate pad applies a voltage needed for the withstand voltage inspection on the gate insulator film in the dummy gate electrode between the emitter electrode and the dummy gate electrode. Therefore; the withstand voltage inspection can be performed on the gate insulator film in the dummy gate electrode.

When the dummy gate pad is opened after the withstand voltage inspection, an electric potential of the dummy gate electrode can be stabilized to an electric potential not contributing to the generation of an inversion layer such as an electric potential equal to that of the emitter electrode.

As above, the withstand voltage inspection can be formed on the gate insulator film in the dummy gate electrode. It is possible to stabilize an electric potential so as not to generate an inversion layer without coupling the dummy gate pad with an emitter electrode after the withstand voltage inspection.

According to an example embodiment, a semiconductor device includes: a semiconductor substrate providing a drift layer having a first conductivity type; a base layer having a second conductivity type and arranged over the drift layer; a plurality of trenches that penetrates the base layer and reaches the drift layer; an emitter region having the first conductivity type, arranged in a surface portion of the base layer, and contacting the trench; an emitter electrode coupled with the base layer and the emitter region; a collector layer having the first conductivity type and arranged on the drift layer opposite to the base layer; a collector electrode coupled with the collector layer; a gate insulator film arranged over a wall surface of the trench; a gate electrode arranged in the trench via the gate insulator film, including a main gate electrode for providing an inversion layer coupling between the emitter electrode and the drift layer when applying a voltage thereon and at least one dummy gate electrode not contributing to generation of the inversion layer; a main gate pad coupled with the main gate electrode; a first dummy gate pad coupled with the dummy gate electrode; a switch arranged between the emitter electrode and a connection point between the dummy gate electrode and the first dummy gate pad; and a second dummy gate pad that controls the switch to shut down or permit conduction. When a voltage is applied to the first dummy gate pad in order to check a withstand voltage of the gate insulator film, the switch is controlled by an input via the second dummy gate pad to shout down the conduction. Under a condition that the withstand voltage is checked, the first dummy gate pad becomes in an open state without applying a voltage thereon, and a terminal of the switch on an emitter electrode side and a terminal of the switch on the connection point side are short-circuited.

The above-described semiconductor device includes the switch, the first dummy gate pad, and the second dummy gate pad as described above. While a voltage is applied to the first dummy gate pad, turning off the switch applies a voltage needed to perform the withstand voltage inspection on the gate insulator film in the dummy gate electrode between the emitter electrode and the dummy gate electrode. Therefore, the withstand voltage inspection can be performed on the gate insulator film in the dummy gate electrode.

After the withstand voltage inspection; an overvoltage is applied to the second dummy gate pad to intentionally short-circuit between a terminal at the emitter electrode side and a terminal at the coupling point side of the switch. This makes it possible to keep the electric potential of the dummy gate electrode equal to the electric potential of the emitter electrode. Namely, it is possible to stabilize an electric potential of the dummy gate electrode so as not to contribute to the generation of an inversion layer.

As above, it is possible to perform withstand voltage inspection on a gate insulator film in a dummy gate electrode and stabilize an electric potential so as not to generate an inversion layer without coupling a pad with an emitter electrode after the withstand voltage inspection.

The description below explains a plurality of embodiments with reference to drawings. Throughout the embodiments, the same reference symbols are given to functionally and/or structurally corresponding parts. In the following description, a Z direction is assumed to correspond to the thickness direction of a semiconductor substrate. An X direction is assumed to be orthogonal to the Z direction and correspond to the direction of placing a plurality of pads. A Y direction is assumed to be orthogonal to both the Z direction and the X direction. Unless otherwise specified, a planar shape corresponds to an XY plane defined by the X direction and the Y direction described above, namely, corresponds to a planar view from the Z direction.

First Embodiment

Figure 2:
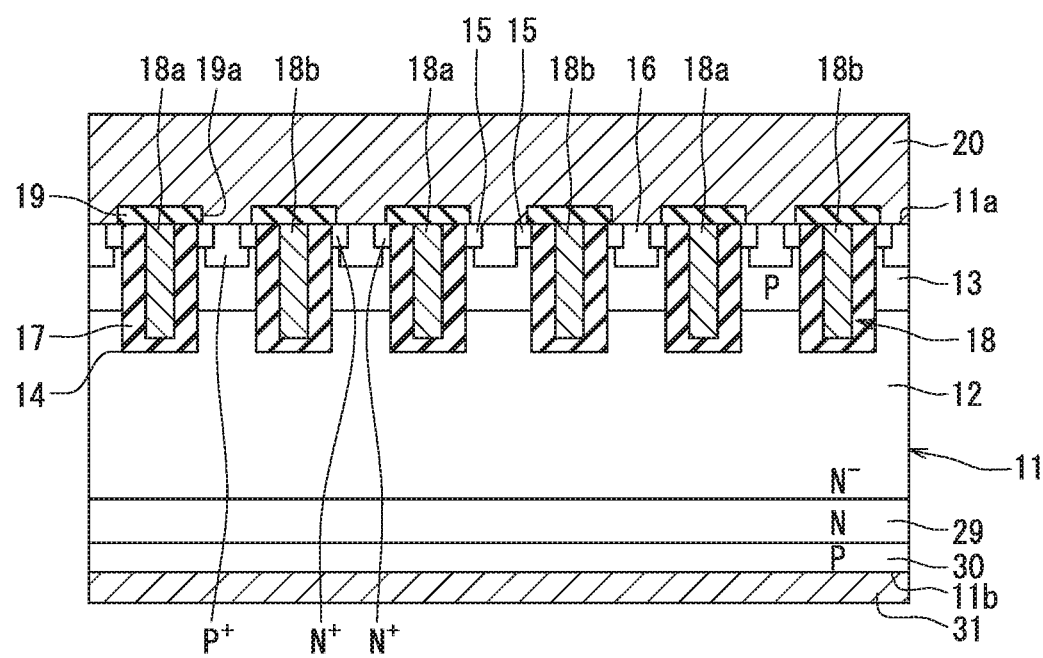
FIG. 2 is a cross sectional view taken along the line II-II of FIG. 1.
Figure 3:
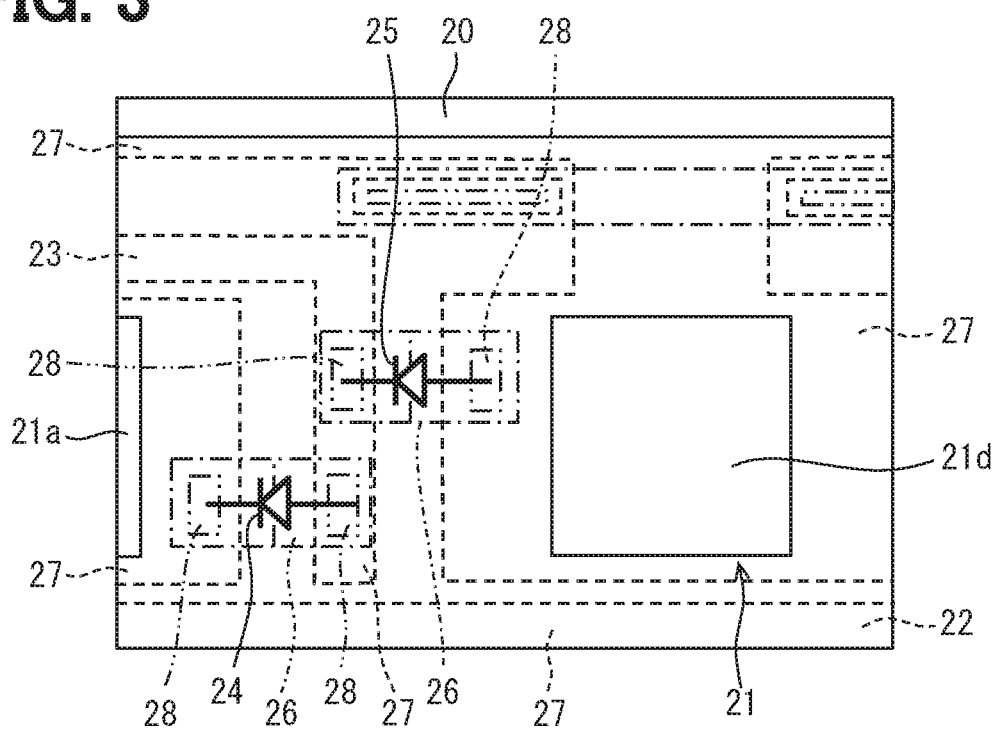
FIG. 3 is a drawing enlarging region III illustrated in FIG. 1.

With reference to FIGS. 1 through 3, the description below explains a configuration of the semiconductor device according to the present embodiment. FIG. 1 uses a broken line to represent an emitter electrode and uses solid lines to represent a gate electrode and wiring coupling the gate electrode with a pad. The semiconductor device according to the present embodiment is used for power converter circuits such as inverters and converters. The present embodiment assumes the first conductivity type to be N-type and the second conductivity type to be P-type.

As illustrated in FIGS. 1 and 2, a semiconductor device 10 includes a semiconductor substrate 11 made of silicon or silicon carbide. The semiconductor substrate 11 includes a one side 11a in the Z direction and a reverse side 11b opposite the one side 11a.

The semiconductor substrate 11 functions as a N--type drift layer 12. The semiconductor substrate 11 configures the drift layer 12. A P-type base layer 13 is formed over the one side 11a of the semiconductor substrate 11, namely, over the drift layer 12. A plurality of trenches 14 are formed over the semiconductor substrate 11 so as to pierce through the base layer 13 and reach the drift layer 12. The trench 14 extends in the X direction while maintaining a specified depth in the Z direction. A plurality of the trenches 14 are formed at a specified pitch (equal interval) in the Y direction. The trenches 14 segment the base layer 13 into a plurality of regions.

A N+-type emitter region 15 and a P+-type body region 16 are formed over a surface layer of the base layer 13. The emitter region 15 is provided with a higher impurity density than the drift layer 12. The emitter region 15 is formed so as to be in touch with a side surface of the trench 14. The emitter region 15 terminates within the base layer 13. The emitter region 15 is structured to extend in a region between the trenches 14 along a longer direction of the trench 14 so as to be in touch with the side surface of the trench 14 and terminate inside the edge in a longer direction of the trench 14.

A body region 16 is provided with a higher impurity density than the base layer 13. Similarly to the emitter region 15, the body region 16 terminates within the base layer 13. The body region 16 is sandwiched between the two emitter regions 15. The body region 16 extends along the longer direction of the trench 14. According to the present embodiment, the body region 16 is deeper than the emitter region 15 with reference to the one side 11a.

A gate insulator film 17 is formed on a wall surface of each trench 14. A gate electrode 18 is placed in each trench 14 via the gate insulator film 17. The gate insulator film 17 is embedded in the trench 14 so as to cover the wall surface of the trench 14. The gate electrode 18 is made of polysilicon, for example. The gate electrode 18 is formed over the gate insulator film 17 and is embedded in the trench 14. In this manner, a trench gate is configured in the semiconductor device 10.

The semiconductor device 10 includes a main gate electrode 18a and a dummy gate electrode 18b as the gate electrode 18. The main gate electrode 18a is provided as the gate electrode 18 that applies a voltage to generate an inversion layer (channel) between an emitter electrode 20 and a drift layer 12 to be described later. Since the present embodiment includes the emitter region 15, the inversion layer intermediates between the emitter region 15 and the drift layer 12 and thereby intermediates between the emitter electrode 20 and the drift layer 12. Meanwhile, the dummy gate electrode 18b is provided as the gate electrode 18 that does not contribute to the generation of the inversion layer.

The main gate electrode 18a and the dummy gate electrode 18b are each formed above a collector layer 30 to be described later. Namely, the dummy gate electrode 18b is also formed within a region to form an IGBT element. According to the present embodiment, the main gate electrode 18a and the dummy gate electrode 18b are alternately formed in the Y direction. The semiconductor device 10 is structured so that a plurality of the gate electrodes 18 are not comprised of all the main gate electrodes 18a but part of the same selectively.

An interlayer insulation film 19 is formed over the base layer 13, namely, over the one side 11a of the semiconductor substrate 11, A contact hole 19a is formed in the interlayer insulation film 19 and exposes part of the emitter region 15 and the body region 16.

The emitter electrode 20 is formed over the interlayer insulation film 19. The emitter electrode 20 is electrically coupled with the emitter region 15 and the body region 16 via the contact hole 19a. The emitter electrode 20 is exposed from an not-shown protective film made of polyimide so as to be capable of coupling with a main terminal.

As illustrated in FIG. 1, a pad 21, a gate wiring 22, and a dummy gate wiring 23 are formed over one side 11a of the semiconductor substrate 11. The pad 21 provides an electrode coupled with a signal terminal and is exposed from the protective film so as to be capable of coupling with the signal terminal. The semiconductor device 10 uses the pad 21 at least including a gate pad 21a electrically coupled with the main gate electrode 18a. According to the present embodiment, the pad 21 includes the gate pad 21a, a pad 21b for cathode and a pad 21c for anode of a temperature sensor (thermostatic diode) to detect the temperature of the semiconductor substrate 11, a pad 21d for Kelvin emitter to detect an electric potential of the emitter electrode 20, and a pad 21e for current sensing. A plurality of the pads 21 are collectively formed at one end of the Y direction and are placed in the X direction over the semiconductor substrate 11 that is approximately formed into a rectangle as a planar view. The pad 21d for Kelvin emitter is hereinafter denoted as a KE pad 21d.

The gate wiring 22 electrically couples the main gate electrode 18a with the gate pad 21a. The dummy gate wiring 23 is electrically coupled with the dummy gate electrode 18b. A diode 24 is placed between the dummy gate wiring 23 and the gate pad 21a. Namely, the dummy gate electrode 18b is coupled with the gate pad 21a via the dummy gate wiring 23 and the diode 24. The diode 25 is placed between the dummy gate wiring 23 and the KE pad 21d. The diode 24 allows the anode to be coupled with the dummy gate wiring 23 and allows the cathode to be coupled with the gate pad 21a. The diode 25 allows the anode to be coupled with the dummy gate wiring 23 and allows the cathode to be coupled with the KE pad 21d. The diode 24 is comparable to a first element. The diode 25 is comparable to a second element.

In FIG. 3, a dot-and-dash line represents a polysilicon layer 26. A broken line represents a metallic layer 27. A two-dot chain line represents a contact 28 of the polysilicon layer 26 and the metallic layer 27. As illustrated in FIG. 3, the diodes 24 and 25 include the polysilicon layer 26. The polysilicon layer 26 is placed over the one side 11a of the semiconductor substrate 11 via a not-shown insulating film.

The metallic layer 27 is formed by using Al—Si as a material. The metallic layer 27 configures the gate wiring 22 and the dummy gate wiring 23. Part of the metallic layer 27 configuring the dummy gate wiring 23 is placed over the polysilicon layer 26 configuring an anode region of the diode 24 and is coupled by the contact 28. Part of the metallic layer 27 configuring the dummy gate wiring 23 is placed over the polysilicon layer 26 configuring a cathode region of the diode 25 and is coupled by the contact 28.

The metallic layer 27 also configures the pad 21 including the gate pad 21a and the KE pad 21d. Part of the metallic layer 27 is exposed from the protective film and is coupled with a signal terminal. Part of the metallic layer 27 configuring the gate pad 21a is placed over the polysilicon layer 26 configuring a cathode region of the diode 24 and is coupled by the contact 28. Part of the metallic layer 27 configuring the KE pad 21d is placed over the polysilicon layer 26 configuring an anode region of the diode 25 and is coupled by the contact 28.

The emitter electrode 20 also includes the metallic layer 27. Part of the metallic layer 27 is exposed from the protective film and is provided as the emitter electrode 20. An not-shown insulating layer intervenes between the polysilicon layer 26 and part of the metallic layer 27 crossing the polysilicon layer 26. The emitter electrode 20 or the pad 21 may be provided with other metallic films (such as a plated film) over an exposed part of the metallic layer 27.

An N-type field-stop layer 29 is formed on the side of the drift layer 12 opposite the side of the base layer 13, namely, on the reverse side 11b of the semiconductor substrate 11. The field-stop layer 29 is not necessarily required. If provided, however, the field-stop layer 29 can prevent a depletion layer from expanding and improve the performance concerning withstand voltage and steady loss. The field-stop layer 29 can also control the injection amount of holes injected from the reverse side 11b.

A P-type collector layer 30 is formed on a side of the field-stop layer 29 opposite the side of the drift layer 12, namely, over a surface layer of the semiconductor substrate 11 at the reverse side 11b. A collector electrode 31 is formed over the collector layer 30. As above, the IGBT element is formed for the semiconductor device 10.

Based on FIGS. 4 and 5, the description below explains a withstand voltage inspection and an IGBT operation in the gate insulator film 17. The withstand voltage inspection, namely, gate screening for the gate insulator film 17 is performed after the manufacture and before the shipment of the semiconductor device 10. The withstand voltage inspection applies a voltage higher than a guarantee voltage to the gate electrode 18 and inspects whether the gate insulator film 17 ensures a targeted withstand voltage, for example. A configuration including the dummy gate electrode 18b also requires the withstand voltage inspection for the gate insulator film 17 in the dummy gate electrode 18b.

As above, the main gate electrode 18a is coupled with the gate pad 21a via the gate wiring 22. The diode 24 is formed between the dummy gate wiring 23 and the gate pad 21a. The diode 25 is formed between the dummy gate wiring 23 and the KE pad 21d.

Figure 4:
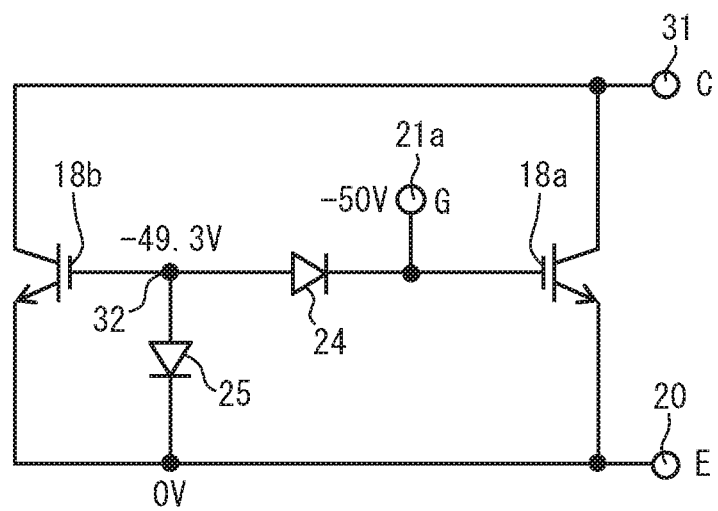
FIG. 4 is a representative circuit schematic of a semiconductor device during withstand voltage inspection on a gate insulator film in a dummy gate electrode.
Figure 5:
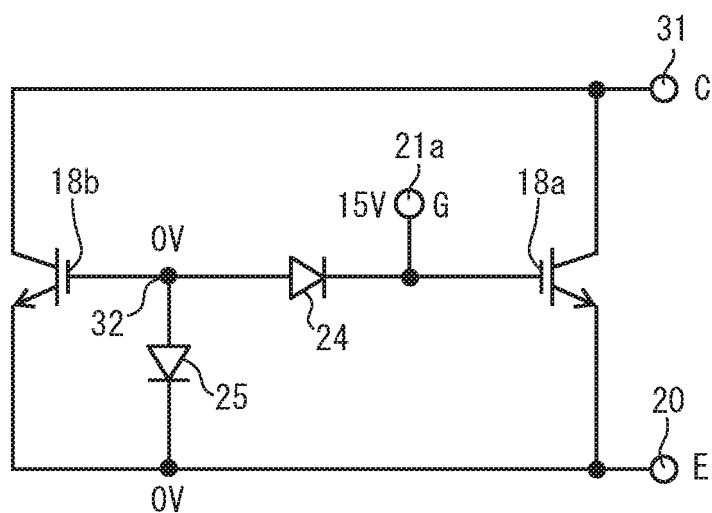
FIG. 5 is a representative circuit schematic of a semiconductor device during IGBT operation.

As illustrated in FIGS. 4 and 5, the gate pad 21a is shared by the main gate electrode 18a and the dummy gate electrode 18b configuring the IGBT element. The diode 24 is formed as the first element between the gate pad 21a and the dummy gate electrode 18b. The diode 24 allows the cathode to be coupled with the gate pad 21a and allows the anode to be coupled with the dummy gate electrode 18b. The diode 25 as the second element is formed between the emitter electrode 20 and the coupling point 32 between the dummy gate electrode 18b and the diode 24. The diode 25 allows the cathode to be coupled with the emitter electrode 20 and allows the anode to be coupled with the coupling point 32, namely the dummy gate electrode 18b. The anodes of the diodes 24 and 25 are coupled with each other.

As illustrated in FIG. 4, during the withstand voltage inspection on the gate insulator film 17 in the dummy gate electrode 18b, the gate pad 21a is applied with a specified voltage such as −50 V whose polarity differs from that of a voltage applied during operation. The specified voltage (−50 V) is comparable to the second voltage. The emitter electrode 20 is set to 0 V. The diode 24 is forward-biased and the diode 25 is reverse-biased along the path of the emitter electrode 20, the diode 25, the diode 24, and the gate pad 21a. Therefore, the diode 24 permits conduction and the diode 25 disallows conduction during the withstand voltage inspection.

The electric potential of the coupling point 32, namely, the dummy gate electrode 18b goes to −49.3 V due to a voltage decrease in the diode 24. Voltage Vge between the dummy gate electrode 18b and the emitter electrode 20 can be higher than the guarantee voltage. Therefore, it is possible to perform the withstand voltage inspection on the gate insulator film 17 in the dummy gate electrode 18b. Since the gate pad 21a is shared, it is also possible to concurrently perform the withstand voltage inspection on the gate insulator film 17 in the dummy gate electrode 18a.

During operation of the IGBT element, a voltage lower than a voltage applied to the collector electrode 31 is applied to the emitter electrode 20. As illustrated in FIG. 5, a turn-on voltage such as 15 V is applied to the gate pad 21a. The turn-on voltage (15 V) is comparable to a first voltage. In this manner, an N-type inversion layer (channel) is formed at part of the main gate electrode 18a in contact with the trench 14 in the base layer 13. Electrons are supplied to the drift layer 12 from the emitter region 15 via the inversion layer. Holes are supplied to the drift layer 12 from the collector layer 30. Conductivity modulation decreases a resistance value of the drift layer 12 to enable an on-state. The turn-on voltage causes gate-emitter voltage Vge to be higher than threshold voltage Vth of a MOS gate at the side of the main gate electrode 18a.

As above, a positive voltage is applied to the gate pad 21a during the IGBT operation. Therefore, the diode 24 is reverse-biased and the diode 25 is forward-biased. The diode 24 disallows conduction and the diode 25 permits conduction during the IGBT operation. The electric potential of the coupling point 32 goes to 0 V equal to that of the emitter electrode 20. Therefore, the dummy gate electrode 18b does not contribute to the generation of the inversion layer during the IGBT operation.

The description below explains effects of the above-described semiconductor device 10.

In the semiconductor device 10 according to the present embodiment, the diode 24 is forward-biased and the diode 25 is reverse-biased during the withstand voltage inspection. The diode 24 permits conduction and the diode 25 disallows conduction. This applies a voltage needed for the withstand voltage inspection between the dummy gate electrode 18b and the emitter electrode 20. Therefore, it is possible to perform the withstand voltage inspection on the gate insulator film 17 in the dummy gate electrode 18b.

The diode 24 is reverse-biased and the diode 25 is forward-biased during the IGBT operation. The diode 24 disallows conduction and the diode 25 permits conduction. Even if a turn-on voltage is applied to the gate pad 21a, it is possible to stabilize the electric potential of the dummy gate electrode 18b so as to be equal to that of the emitter electrode 20, namely, so as not to contribute to the generation of an inversion layer.

As above, the withstand voltage inspection can be performed on the gate insulator film 17 in the dummy gate electrode 18b. Even if no pad is coupled with the emitter electrode 20 after the withstand voltage inspection, the electric potential of the dummy gate electrode 18b can be stabilized so as not to generate an inversion layer. It is possible to eliminate a wire bonding process to couple a pad with the emitter electrode 20, for example.

The main gate electrode 18a and the dummy gate electrode 18b share the gate pad 21a. The main gate electrode 18a and the dummy gate electrode 18b can enable the withstand voltage inspection to be simultaneously performed on the gate insulator film 17. It is also possible to reduce the pads 21 or wirings.

The dummy gate electrode 18b is formed as an alternate structure in the region to form the IGBT element. It is possible to reduce a feedback capacity (a gate-collector capacity) and thereby improve switching speed. Reducing the feedback capacity can suppress a withstand voltage decrease due to a concentration of electric fields compared to a configuration that decreases the number of the main gate electrodes 18a.

The present embodiment has described the example of using the diode 24 as the first element and the diode 25 as the second element but is not limited thereto. The first element placed between the gate pad 21a and the dummy gate electrode 18b may be configured to disallow or limit conduction during the IGBT operation in order to prevent the dummy gate electrode 18b from contributing to the generation of an inversion layer and permit conduction during the withstand voltage inspection. Disallowing or limiting conduction during the IGBT operation to avoid contribution to the generation of an inversion layer signifies setting voltage Vge between the dummy gate electrode 18b and the emitter electrode 20 to be lower than or equal to threshold voltage Vth for the MOS gate when a turn-on voltage is applied to the gate pad 21a. The second element placed between the emitter electrode 20 and the coupling point 32 may be configured to permit conduction during the IGBT operation and disallow or limit conduction during the withstand voltage inspection in order to apply a voltage higher than the guarantee voltage to the dummy gate electrode 18b.

Figure 6:
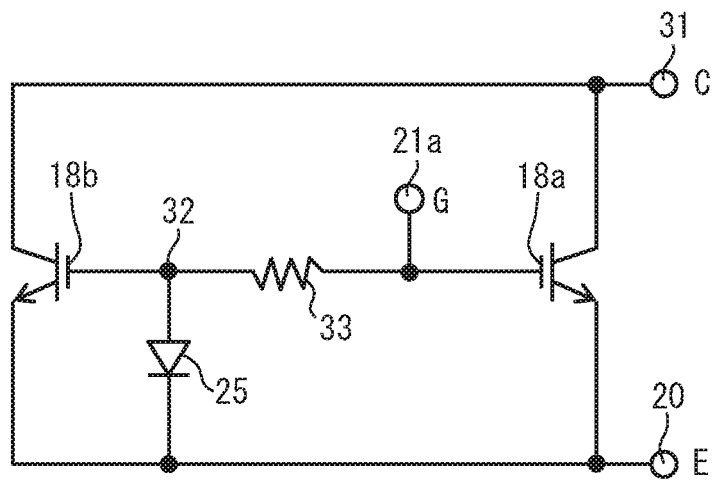
FIG. 6 is a drawing illustrating a first modification.

A resistor 33 may be used as the first element according to a first modification as illustrated in FIG. 6. The resistor 33 permits conduction and the diode 25 disallows conduction when a specified voltage (−50 V) is applied to the gate pad 21a for the purpose of the withstand voltage inspection. Therefore, the electric potential of the coupling point 32 (dummy gate electrode 18b) goes to −50 V, making it possible to appropriately perform the withstand voltage inspection on the gate insulator film 17 in the dummy gate electrode 18b. The diode 25 is forward-biased when the turn-on voltage (15V) is applied to the gate pad 21a. The diode 25 permits conduction, setting the electric potential of the coupling point 32 to 0.7 V. It is possible to stabilize the electric potential of the dummy gate electrode 18b so as not to contribute to the generation of an inversion layer.

Figure 7:
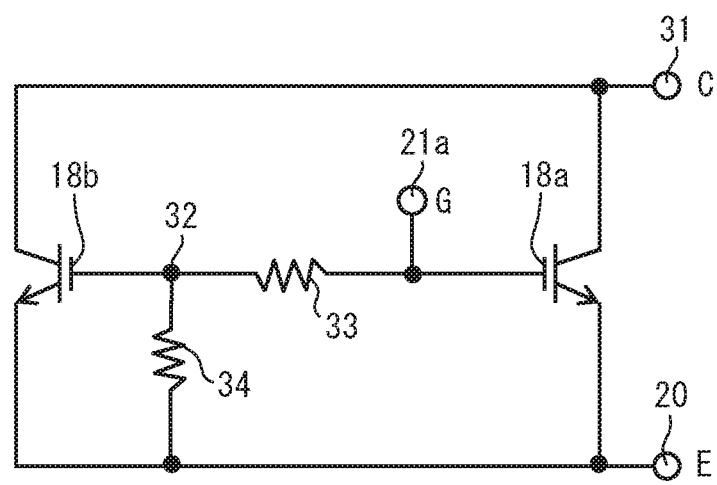
FIG. 7 is a drawing illustrating a second modification.

The resistor 33 may be used as the first element and the resistor 34 may be used as the second element according to a second modification as illustrated in FIG. 7. In this case, the resistors 33 and 34 divide a voltage applied to the gate pad 21a. The electric potential of the coupling point 32 goes higher than or equal to the guarantee voltage when a specified voltage (−50 V) is applied to the gate pad 21a for the purpose of the withstand voltage inspection. Values of the resistors 33 and 34 are set so that the electric potential of the coupling point 32 goes lower than or equal to threshold voltage Vth for the MOS gate when a turn-on voltage (15 V) is applied to the gate pad 21a. The resistor 33 limits conduction during the IGBT operation in order to prevent the dummy gate electrode 18b from contributing to the generation of an inversion layer and permits conduction during the withstand voltage inspection. The resistor 34 permits conduction during the IGBT operation and limits conduction during the withstand voltage inspection in order to apply a voltage higher than the guarantee voltage to the dummy gate electrode 18b.

Second Embodiment

The present embodiment can reference the preceding embodiment. Therefore, the description below omits the contents overlapping with the semiconductor device 10 described in the preceding embodiment.

Figure 8:
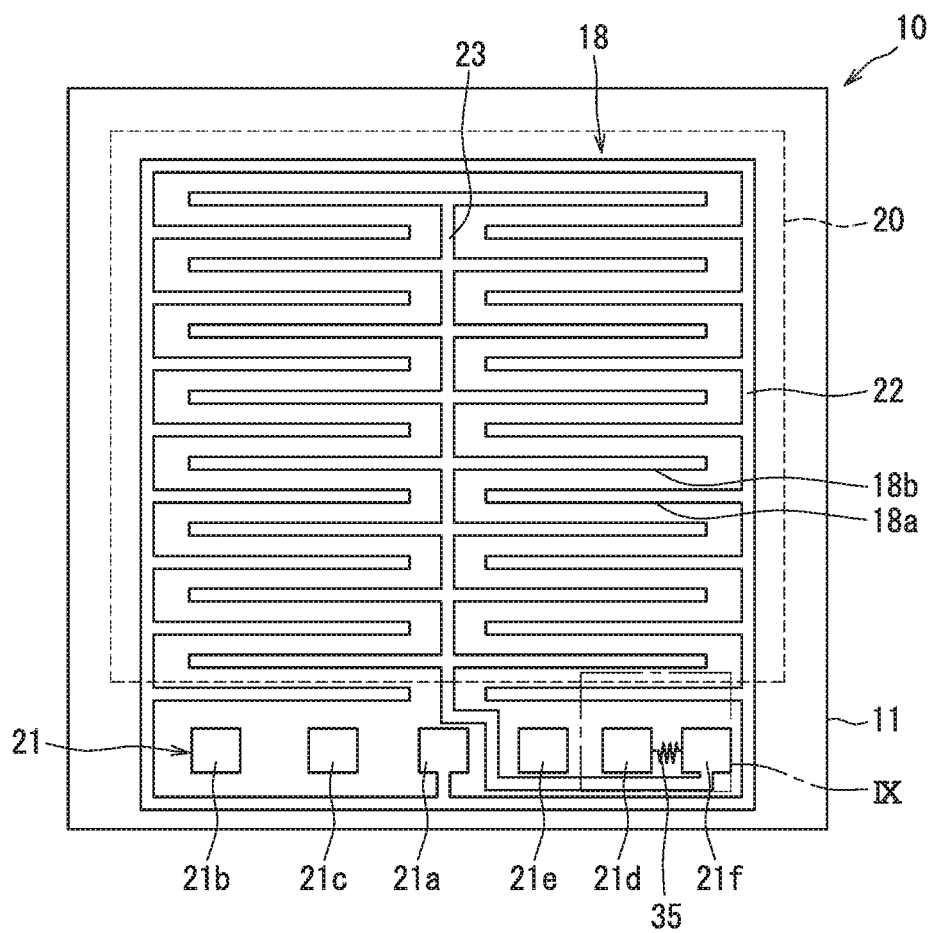
FIG. 8 is a plan view illustrating a schematic configuration of a semiconductor device according to a second embodiment.

As illustrated in FIG. 8, the semiconductor device 10 according to the present embodiment includes a dummy gate pad 21f coupled with the dummy gate electrode 18b in addition to the gate pad 21a coupled with the main gate electrode 18a. A resistor 35 is formed as a third element between the KE pad 21d and the dummy gate pad 21f. The gate pad 21a is comparable to the main gate pad.

Figure 9:
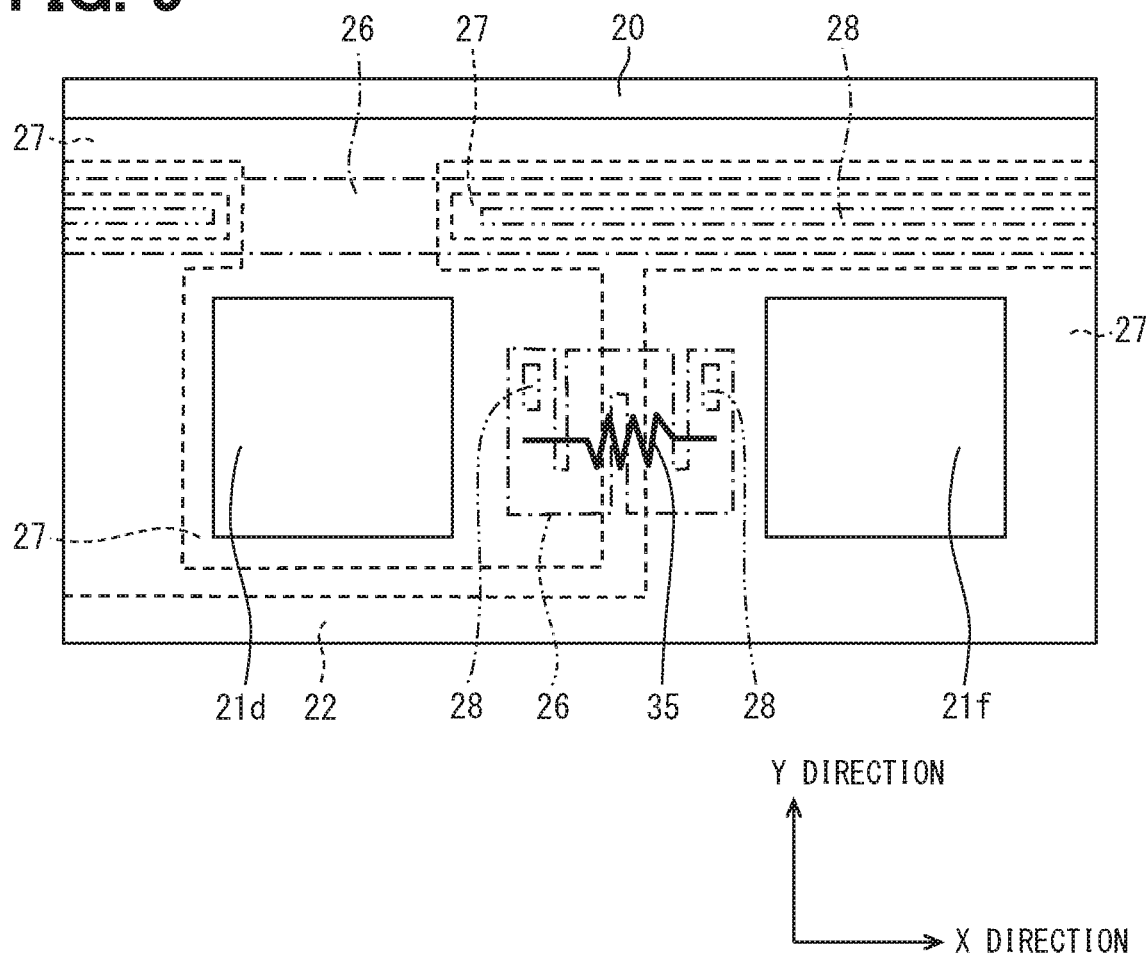
FIG. 9 is a drawing enlarging region IX illustrated in FIG. 8.

In FIG. 9 like FIG. 3, a dot-and-dash line represents the polysilicon layer 26. A broken line represents the metallic layer 27. A two-dot chain line represents the contact 28 of the polysilicon layer 26 and the metallic layer 27. The resistor 33 is configured to include the polysilicon layer 26. The polysilicon layer 26 configuring the resistor 33 forms a plane meandering shape (i.e., a meander shape). Part of the metallic layer 27 configuring the KE pad 21d is layered over one end of the polysilicon layer 26 configuring the resistor 33 and is coupled with the contact 28. Part of the metallic layer 27 configuring the dummy gate pad 21f is layered over the other end of the polysilicon layer 26 configuring the resistor 33 and is coupled with the contact 28.

Figure 10:
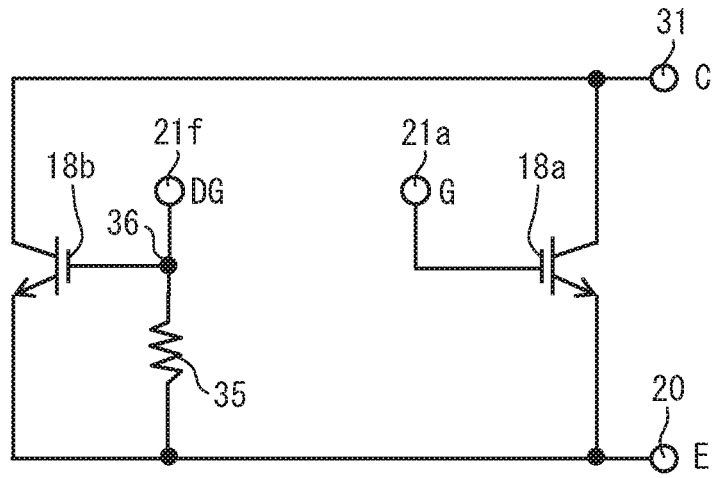
FIG. 10 is a representative circuit schematic of a semiconductor device.

FIG. 10 illustrates a representative circuit of the semiconductor device 10. The gate pad 21a is provided as a dedicated pad for the main gate electrode 18a configuring the IGBT element. The dummy gate pad 21f is provided as a dedicated pad for the dummy gate electrode 18b. The resistor 35 as the third element is formed between the emitter electrode 20 and a coupling point 36 between the dummy gate electrode 18b and the dummy gate pad 21f.

The resistor 35 disallows conduction when a specified voltage such as 50 V is applied to the dummy gate pad 21f during the withstand voltage inspection on the gate insulator film 17 in the dummy gate electrode 18b. The electric potential of the coupling point 36, namely, the electric potential of the dummy gate electrode 18b goes to 50 V.

Therefore, it is possible to appropriately perform the withstand voltage inspection on the gate insulator film 17 of the dummy gate electrode 18b. The specified voltage applied to the dummy gate pad 21f is not limited to a positive voltage. A voltage of −50 V may be applied, for example. Applying a specified voltage may ensure voltage Vge between the dummy gate electrode 18b and the emitter electrode 20 to be higher than or equal to the guarantee voltage.

A turn-on voltage such as 15 V is applied to the gate pad 21a during operation of the IGBT element. However, the dummy gate pad 21f is separated from the gate pad 21a and is opened to allow no voltage to be applied. The coupling point 36 is coupled with the emitter electrode 20 via the resistor 33. The electric potential of the coupling point 36, namely, the electric potential of the dummy gate electrode 18b goes to 0 V equal to the emitter electrode 20. The resistor 35 permits conduction. Therefore, the dummy gate electrode 18b does not contribute to the generation of an inversion layer during the IGBT operation.

The semiconductor device 10 according to the present embodiment provides the dummy gate pad 21f in addition to the gate pad 21a and can apply an independent voltage to the dummy gate pad 21f. It is possible to appropriately perform the withstand voltage inspection on the gate insulator film 17 in the dummy gate electrode 18b. Provision of the resistor 35 can stabilize the electric potential of the dummy gate electrode 18b so as not to generate an inversion layer without coupling the dummy gate pad 21f with the emitter electrode 20 after the withstand voltage inspection.

The present embodiment has described the example of using the resistor 35 as the third element but is not limited thereto. The third element placed between the emitter electrode 20 and the coupling point 36 may be configured to permit conduction in the open state of the dummy gate pad 21f (during the IGBT operation) and disallow or limit conduction during the withstand voltage inspection in order to apply a voltage higher than the guarantee voltage to the dummy gate electrode 18b.

Figure 11:
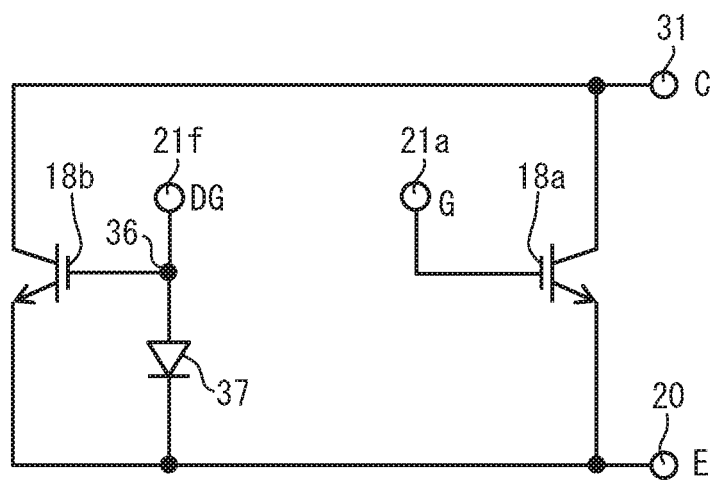
FIG. 11 is a drawing illustrating a third modification.

A diode 37 may be used as the third element according to a third modification as illustrated in FIG. 11. The cathode of the diode 37 is coupled with the emitter electrode 20 and the anode thereof is coupled with the coupling point 36. The diode 37 is reverse-biased and disallows conduction when the dummy gate pad 21f is supplied with a specified voltage (such as −50 V) having a polarity different from that of the turn-on voltage for the purpose of the withstand voltage inspection. Therefore, the electric potential of the coupling point 36 also goes to −50 V. It is possible to appropriately perform the withstand voltage inspection on the gate insulator film 17 in the dummy gate electrode 18b. When the dummy gate pad 21f is opened, the coupling point 36 is coupled with the emitter electrode 20 via the diode 37. The electric potential of the coupling point 36 goes to 0.7 V. The diode 37 permits conduction. Therefore, the dummy gate electrode 18b does not contribute to the generation of an inversion layer during the IGBT operation.

Figure 12:
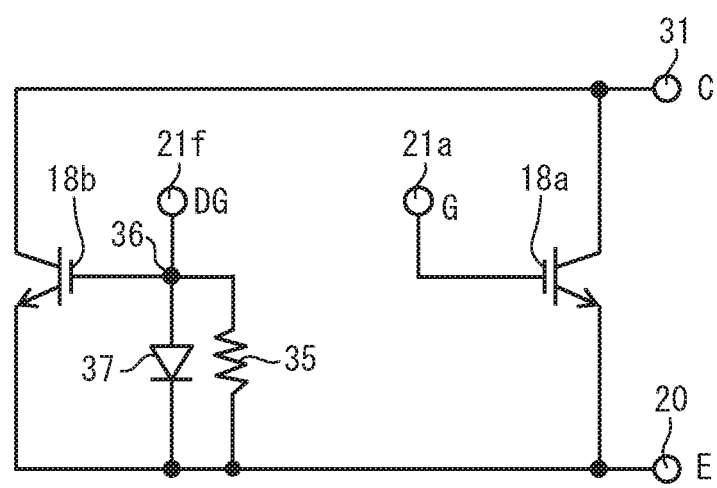
FIG. 12 is a drawing illustrating a fourth modification.

The resistor 35 and the diode 37 may be used as the third element according to a fourth modification as illustrated in FIG. 12. The resistor 35 and the diode 37 are coupled in parallel between the emitter electrode 20 and the coupling point 36. It is possible to appropriately perform the withstand voltage inspection on the gate insulator film 17 in the dummy gate electrode 18b by supplying the dummy gate pad 21f with a specified voltage (such as −50 V) having a polarity different from that of the turn-on voltage for the purpose of the withstand voltage inspection. Opening the dummy gate pad 21f makes it possible to stabilize the electric potential of the dummy gate electrode 18b so as not to contribute to the generation of an inversion layer even during the IGBT operation.

Figure 13:
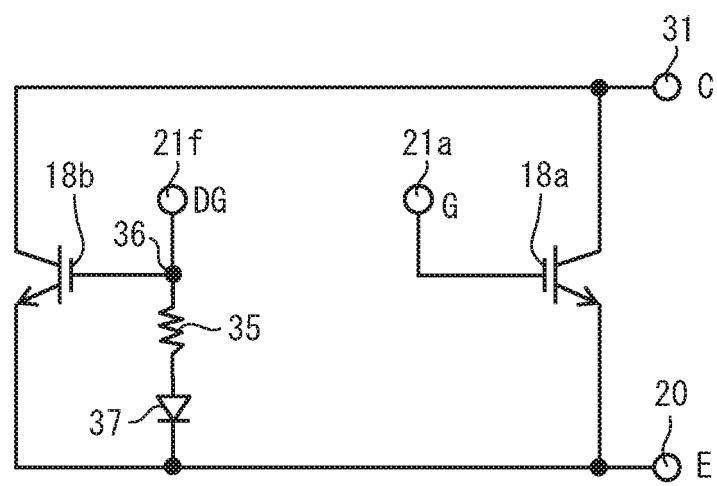
FIG. 13 is a drawing illustrating a fifth modification.

According to a fifth modification illustrated in FIG. 13, unlike the fourth modification, the resistor 35 and the diode 37 are serially coupled between the emitter electrode 20 and the coupling point 36. The resistor 35 is positioned toward the coupling point and is coupled with the cathode of the diode 37 and emitter electrode 20. The resistor 35 disallows or limits conduction when the dummy gate pad 21f is supplied with a specified voltage (such as 50 V) for the purpose of the withstand voltage inspection. It is, therefore, possible to appropriately perform the withstand voltage inspection on the gate insulator film 17 in the dummy gate electrode 18b. Opening the dummy gate pad 21f makes it possible to stabilize the electric potential of the dummy gate electrode 18b so as not to contribute to the generation of an inversion layer even during the IGBT operation. It may be advantageous to apply a voltage (such as −50 V) having a polarity different from that of the turn-on voltage during the withstand voltage inspection.

Figure 14:
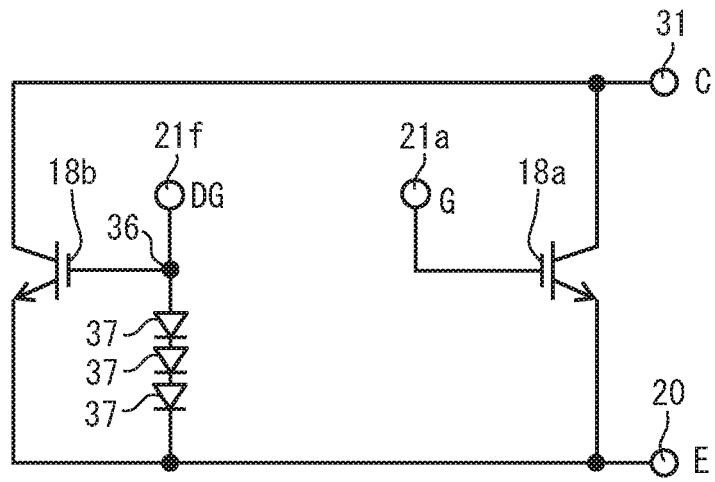
FIG. 14 is a drawing illustrating a sixth modification.

If the diode 37 lacks a sufficient withstand voltage, a plurality of the diodes 37 may be used according to a sixth modification as illustrated in FIG. 14. In FIG. 14, the three diodes 37 are serially coupled between the emitter electrode 20 and the coupling point 36. The cathode of each diode 37 is positioned toward the emitter electrode 20. Also in this configuration, it is possible to appropriately perform the withstand voltage inspection on the gate insulator film 17 in the dummy gate electrode 18b by supplying the dummy gate pad 21f with a specified voltage (such as −50 V) having a polarity different from that of the turn-on voltage for the purpose of the withstand voltage inspection. Opening the dummy gate pad 21f makes it possible to stabilize the electric potential of the dummy gate electrode 18b so as not to contribute to the generation of an inversion layer even during the IGBT operation.

Third Embodiment

The present embodiment can reference the preceding embodiments. Therefore, the description below omits the contents overlapping with the semiconductor device 10 described in the preceding embodiments.

Figure 15:
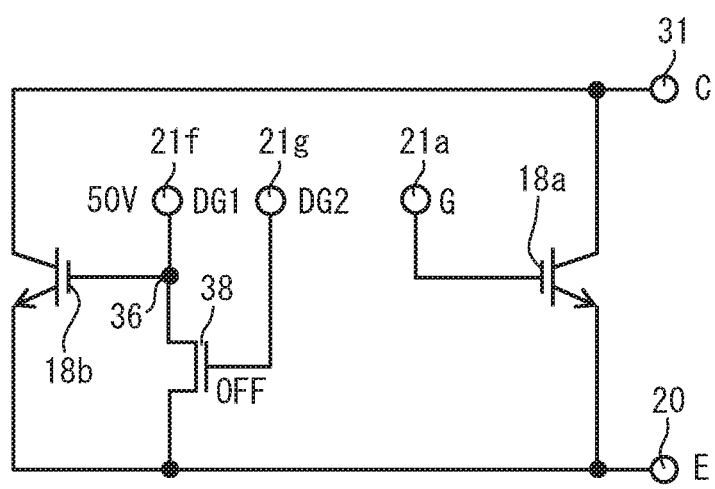
FIG. 15 is a representative circuit schematic of a semiconductor device according to a third embodiment illustrating a state before shipment.

FIG. 15 illustrates the semiconductor device 10 according to the present embodiment in a state before shipment. FIG. 15 illustrates an instance of the withstand voltage inspection on the gate insulator film 17 in the dummy gate electrode 18b. The semiconductor device 10 according to the present embodiment also includes the dummy gate pad 21f coupled with the dummy gate electrode 18b in addition to the gate pad 21a, A switch 38 is formed between the emitter electrode 20 and the coupling point 36 between the dummy gate pad 21f and the dummy gate electrode 18b. The switch 38 includes a control electrode (gate). The present embodiment uses MOSFET as the switch 38.

The semiconductor device 10 moreover includes a dummy gate pad 21g. The dummy gate pad 21g is provided as the pad 21 that controls the switch 38 to permit or disallow conduction. The dummy gate pad 21f is comparable to a first dummy gate pad. The dummy gate pad 21g is comparable to a second dummy gate pad.

As illustrated in FIG. 15, the withstand voltage inspection is performed on the gate insulator film 17 in the dummy gate electrode 18b before product shipment of the semiconductor device 10. At this time, the dummy gate pad 21g is not supplied with a voltage the switch 38 turns on. The dummy gate pad 21f is supplied with a specified voltage (such as 50 V) for the withstand voltage inspection. When turned off, the switch 38 disallows conduction. The electric potential of the coupling point 36, namely, the electric potential of the dummy gate electrode 18b goes to 50 V. It is possible to appropriately perform the withstand voltage inspection on the gate insulator film 17 in the dummy gate electrode 18b. It may be advantageous to apply the specified voltage by using a voltage (such as −50 V) having a polarity different from that of the turn-on voltage.

Figure 16:
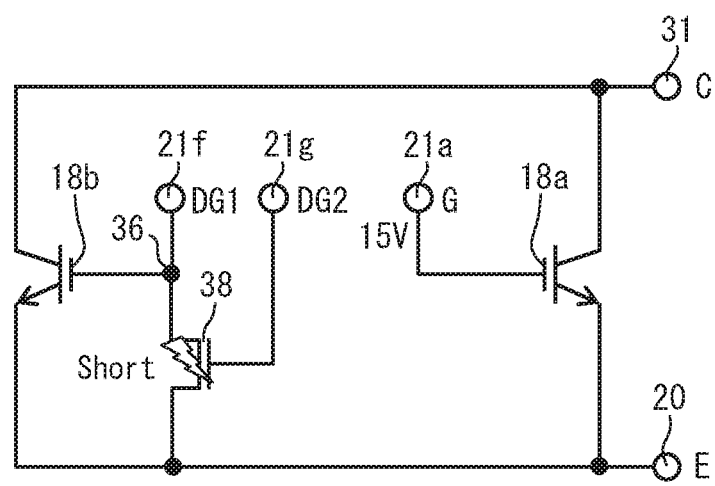
FIG. 16 is a representative circuit schematic of a semiconductor device illustrating a state after shipment.

FIG. 16 illustrates the semiconductor device 10 after short-circuiting of the switch 38, namely, the semiconductor device 10 after product shipment. The short-circuiting is performed after the withstand voltage inspection. An overvoltage is applied to the dummy gate pad 21g to break the switch 38 and short-circuit between the drain and the source. The switch 38 thereby remains turned on without applying a voltage to the dummy gate pad 21g.

Even when the turn-on voltage (such as 15 V) is applied to the gate pad 21a as illustrated in FIG. 16, the short-circuited switch 38 causes the electric potential of the coupling point 36, namely, the electric potential of the dummy gate electrode 18b to be equal to the electric potential of the emitter electrode 20. Therefore, the dummy gate electrode 18b does not contribute to the generation of an inversion layer during the IGBT operation.

As above, the semiconductor device 10 according to the present embodiment can also perform the withstand voltage inspection on the gate insulator film 17 in the dummy gate electrode 18b. In addition, it is possible to stabilize the electric potential of the dummy gate electrode 18b so as not to generate an inversion layer without coupling the dummy gate pad 21f with the emitter electrode 20 after the withstand voltage inspection.

Fourth Embodiment

The present embodiment can reference the preceding embodiments. Therefore, the description below omits the contents overlapping with the semiconductor device 10 described in the preceding embodiments.

Figure 17:
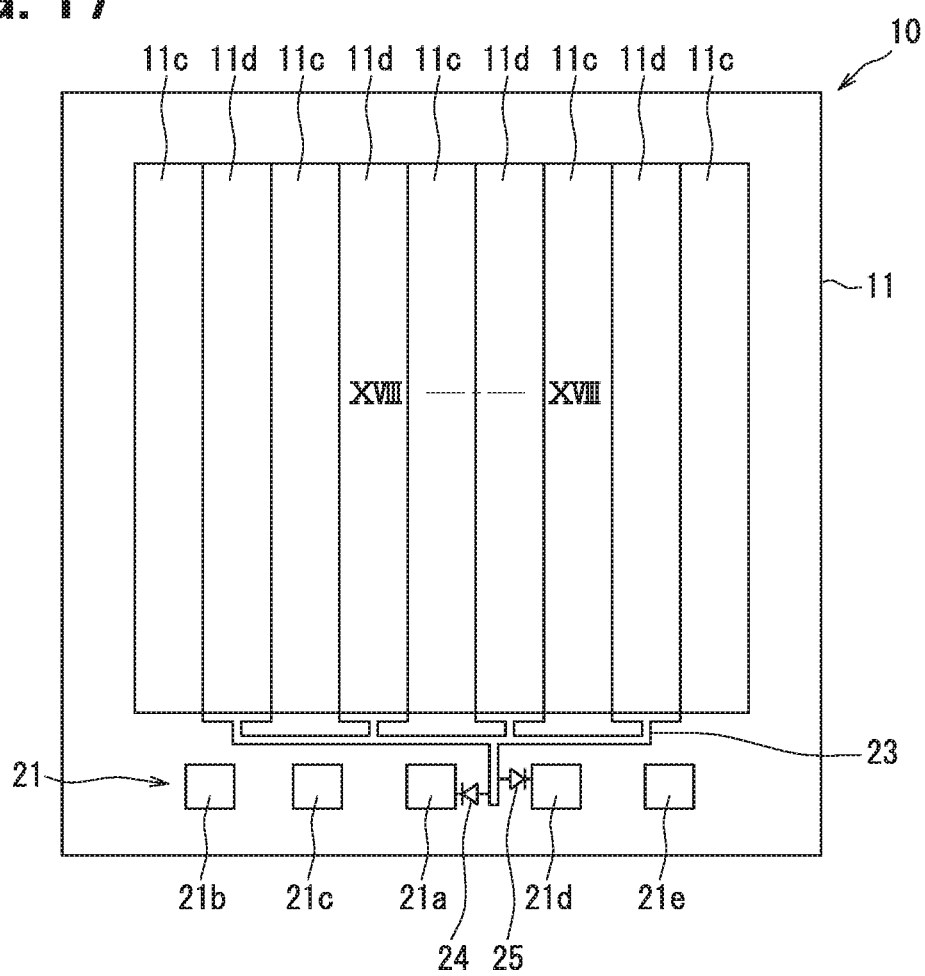
FIG. 17 is a plan view illustrating a schematic configuration of a semiconductor device according to a fourth embodiment.
Figure 18:
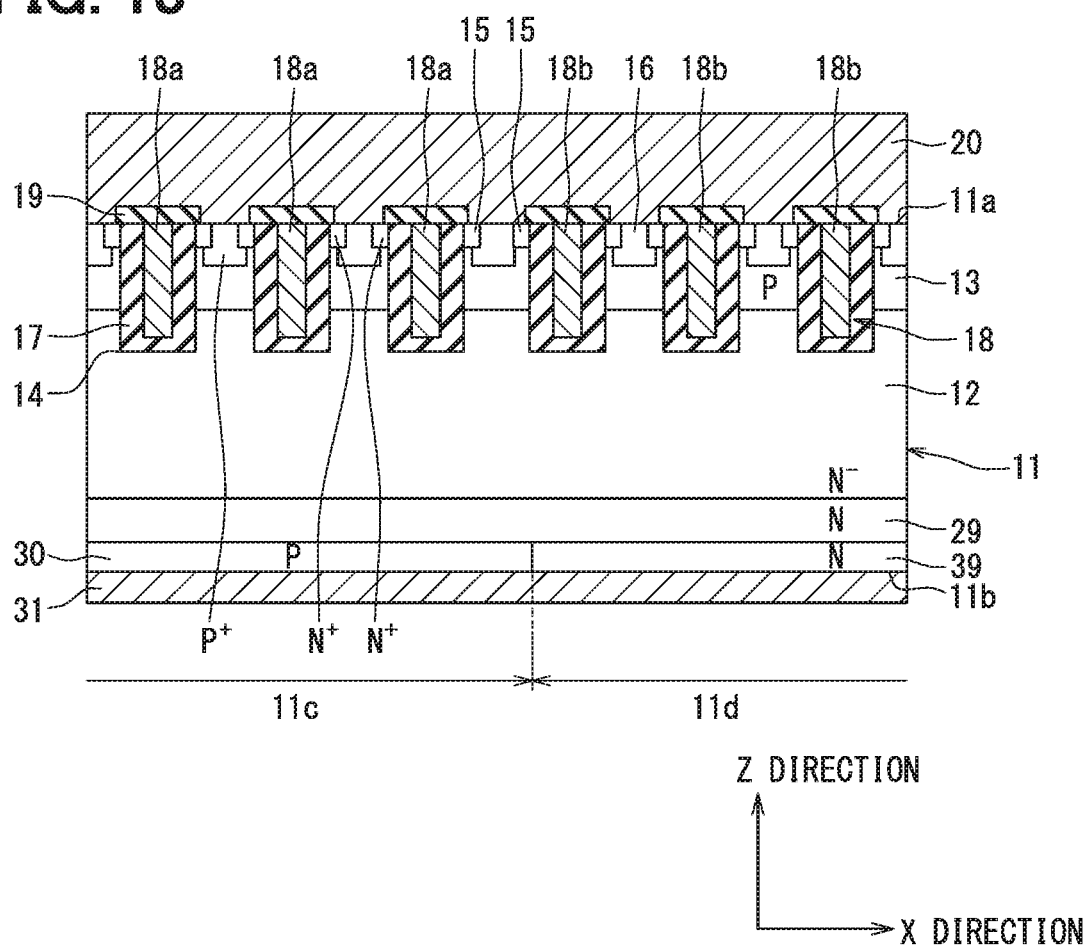
FIG. 18 is a cross sectional view taken along the line XVIII-XVIII of FIG. 17.

The preceding embodiments have described the example of forming the dummy gate electrode 18b in the region to form the IGBT element. Meanwhile, as illustrated in FIGS. 17 and 18, the semiconductor device 10 according to the present embodiment allows the semiconductor substrate 11 to include an IGBT region 11c to form the IGBT element and a diode region 11d to form a freewheel diode element (FWD). The IGBT region 11c and the diode region 11d are alternately formed in the X direction. The IGBT region 11c and the diode region 11d each extend in the Y direction.

The surface layer of the semiconductor substrate 11 at the one side 11a is structured equally to the IGBT region 11c and the diode region 11d. Namely, the trench 14 is formed in the IGBT region 11c and the diode region 11d each. A plurality of the trenches 14 are formed at an equal interval in the X direction. The emitter region 15 and the body region 16 are also formed in the IGBT region 11c and the diode region 11d, respectively. The main gate electrode 18a is formed in the IGBT region 11c. The dummy gate electrode 18b is formed in the diode region 11d. The emitter electrode 20 is electrically coupled with the emitter region 15 and the body region 16 in the IGBT region 11c and the diode region 11d. Therefore, the emitter electrode 20 also functions as an anode electrode for the freewheel diode element.

The pad 21 is formed over the one side 11a of the semiconductor substrate 11 similarly to the first embodiment (see FIG. 1). The gate pad 21a and the KE pad 21d are formed as the pad 21. The diode 24 is placed between the dummy gate wiring 23 and the gate pad 21a. The diode 25 is placed between the dummy gate wiring 23 and the KE pad 21d. The diode 24 allows the anode to be coupled with the dummy gate wiring 23 and allows the cathode to be coupled with the gate pad 21a. The diode 25 allows the anode to be coupled with the dummy gate wiring 23 and allows the cathode to be coupled with the KE pad 21d. The diode 24 is comparable to the first element. The diode 25 is comparable to the second element. FIG. 17 omits the gate wiring 22 for the sake of convenience.

The IGBT region 11c forms the P-type collector layer 30 and the diode region 11d forms an N-type cathode layer 39 over the field-stop layer 29 opposite the drift layer 12, namely, over the surface layer of the semiconductor substrate 11 at the reverse side 11b. The collector layer 30 and the cathode layer 39 are placed in parallel. The collector electrode 31 is formed over the collector layer 30 and the cathode layer 39. Therefore, the collector electrode 31 also functions as a cathode electrode of the freewheel diode element.

As above, the semiconductor substrate 11 forms the IGBT element and the freewheel diode element. Namely, the RC-IGBT is formed. The diode region 11d forms the dummy gate electrode 18b.

The semiconductor device 10 according to the present embodiment includes the diodes 24 and 25 described above. Therefore, the present embodiment can provide effects comparable to those of the first embodiment. During the withstand voltage inspection, the diode 24 permits conduction and the diode 25 disallows conduction. A voltage needed for the withstand voltage inspection is applied between the dummy gate electrode 18b and the emitter electrode 20. Therefore, it is possible to appropriately perform the withstand voltage inspection on the gate insulator film 17 in the dummy gate electrode 18b. During the IGBT operation, the diode disallows conduction and the diode 25 permits conduction. The electric potential of the dummy gate electrode 18b can be maintained equal to the electric potential of the emitter electrode 20 while the gate pad 21a is shared.

As above, the withstand voltage inspection can be performed on the gate insulator film 17 in the dummy gate electrode 18b. Even if no pad is coupled with the emitter electrode 20 after the withstand voltage inspection, the electric potential of the dummy gate electrode 18b can be stabilized so as not to generate an inversion layer. It is possible to eliminate a wire bonding process to couple a pad with the emitter electrode 20, for example.

The main gate electrode 18a and the dummy gate electrode 18b share the gate pad 21a. The main gate electrode 18a and the dummy gate electrode 18b can enable the withstand voltage inspection to be simultaneously performed on the gate insulator film 17. It is also possible to reduce the pads 21 or wirings.

The trench 14 is formed in not only the IGBT region 11c but also the diode region 11d. It is possible to prevent a withstand voltage from decreasing due to an electric field concentration on the trench 14 near the diode region 11d in the IGBT region 11c.

The above-described example (described in the first embodiment) does not limit the configuration that can perform the withstand voltage inspection on the gate insulator film 17 in the dummy gate electrode 18b and stabilize the electric potential of the dummy gate electrode 18b so as not to generate an inversion layer even if no pad is coupled with the emitter electrode 20 after the withstand voltage inspection. There are available combinations of the other preceding embodiments and the configurations described in the modifications.

The disclosure of this specification is not limited to the described embodiments. The disclosure includes the described embodiments and modified forms provided by those skilled in the art based on the embodiments. For example, the disclosure is not limited to combinations of the elements described in the embodiments. The disclosure is available in various combinations. The disclosed technical scope is not limited to the description of the embodiments. Some of the disclosed technical scopes need to be understood to be available in the description of the claims and to include all changes in the meaning and the scope comparable to the description of the claims.

There has been described the example of assuming the first conductivity type to be the N-type and the second conductivity type to be the P-type. The first conductivity type may be assumed to be the P-type and the second conductivity type to be the N-type.

There has been described the example of forming the dummy gate electrode 18b in the region to form the IGBT element. There has been described the example of forming the dummy gate electrode 18b in the diode region 11d. However; the dummy gate electrode 18b may be formed in both the IGBT region 11c and the diode region 11d.

The emitter region 15 may be formed for part of the main gate electrode 18a adjacent to the trench 14 and may not be formed for part of the dummy gate electrode 18b adjacent to the trench 14. The body region 16 may not be formed in the diode region 11d While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
a semiconductor substrate providing a drift layer having a first conductivity type;
a base layer having a second conductivity type and arranged over the drift layer;
a plurality of trenches that penetrates the base layer and reaches the drift layer;
an emitter region having the first conductivity type, arranged in a surface portion of the base layer, and contacting the trench;
an emitter electrode coupled with the base layer and the emitter region;
a collector layer having the first conductivity type and arranged on the drift layer opposite to the base layer;
a collector electrode coupled with the collector layer;
a gate insulator film arranged over a wall surface of the trench;
a gate electrode arranged in the trench via the gate insulator film, including a main gate electrode for providing an inversion layer coupling between the emitter electrode and the drift layer when applying a voltage thereon and at least one dummy gate electrode not contributing to generation of the inversion layer;
a gate pad common to the main gate electrode and the dummy gate electrode;

a first element that is arranged between the dummy gate electrode and the gate pad, shuts down or restricts conduction in order for the dummy gate electrode not to contribute to the generation of the inversion layer when a first voltage is applied to the main gate electrode via the gate pad in order to generate the inversion layer, and permits the conduction when a second voltage having a polarity reverse to the first voltage is applied to the gate pad; and
a second element that is arranged between the emitter electrode and a connection point between the dummy gate electrode and the first element, permits the conduction when applying the first voltage, and shuts down or restricts the conduction when applying the second voltage.

2. The semiconductor device according to claim 1, wherein:
each of the first element and the second element is provided by a diode; and
an anode of the first element is coupled with an anode of the second element.

3. The semiconductor device according to claim 1, wherein:
the at least one dummy gate electrode includes a plurality of dummy gate electrodes; and
at least a part of the plurality of dummy gate electrodes is arranged above the collector layer.

4. The semiconductor device according to claim 1, further comprising:
a cathode layer having the first conductivity type, arranged on the drift layer opposite to the base layer, and arranged in parallel with the collector layer, wherein:
the collector electrode is coupled with the collector layer and the cathode layer;
the at least one dummy gate electrode includes a plurality of dummy gate electrodes;
the semiconductor substrate includes an IGBT region functioning as an IGBT element and a diode region functioning as a diode element;
the plurality of trenches are arranged in the IGBT region and the diode region; and
at least a part of the plurality of dummy gate electrodes is arranged in the diode region.

5. A semiconductor device comprising:
a semiconductor substrate providing a drift layer having a first conductivity type;
a base layer having a second conductivity type and arranged over the drift layer;
a plurality of trenches that penetrates the base layer and reaches the drift layer;
an emitter region having the first conductivity type, arranged in a surface portion of the base layer, and contacting the trench;
an emitter electrode coupled with the base layer and the emitter region;
a collector layer having the first conductivity type and arranged on the drift layer opposite to the base layer;
a collector electrode coupled with the collector layer;
a gate insulator film arranged over a wall surface of the trench;
a gate electrode arranged in the trench via the gate insulator film, including a main gate electrode for providing an inversion layer coupling between the emitter electrode and the drift layer when applying a voltage thereon and at least one dummy gate electrode not contributing to generation of the inversion layer;

a main gate pad coupled with the main gate electrode;

a dummy gate pad coupled with the dummy gate electrode; and a third element that is arranged between the emitter electrode and a connection point between the dummy gate electrode and the dummy gate pad, shuts down or restricts conduction when a predetermined voltage is applied to the dummy gate pad, and permits the conduction when the dummy gate pad is in an open state without applying a voltage thereon.

6. The semiconductor device according to claim 5, wherein:

the third element is provided by a resistor.

7. The semiconductor device according to claim 5, wherein:

the at least one dummy gate electrode includes a plurality of dummy gate electrodes; and at least a part of the plurality of dummy gate electrodes is arranged above the collector layer.

8. The semiconductor device according to claim 5, further comprising:

a cathode layer having the first conductivity type, arranged on the drift layer opposite to the base layer, and arranged in parallel with the collector layer, wherein:

the collector electrode is coupled with the collector layer and the cathode layer;

the at least one dummy gate electrode includes a plurality of dummy gate electrodes;

the semiconductor substrate includes an IGBT region functioning as an IGBT element and a diode region functioning as a diode element;

the plurality of trenches are arranged in the IGBT region and the diode region; and at least a part of the plurality of dummy gate electrodes is arranged in the diode region.

* * * * *